United States Patent
Drouin (10) Patent No.: US 11,435,206 B2
(45) Date of Patent: Sep. 6, 2022

(54) PHASE COMPENSATION FOR AN INDUCTIVE POSITION SENSOR

(71) Applicant: Allegro MicroSystems, LLC, Manchester, NH (US)

(72) Inventor: Mathew Drouin, Hooksett, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 181 days.

(21) Appl. No.: 17/082,151

(22) Filed: Oct. 28, 2020

(65) Prior Publication Data

US 2022/0128382 A1    Apr. 28, 2022

(51) Int. Cl.
*G01D 5/22* (2006.01)
*H03L 7/099* (2006.01)
(Continued)

(52) U.S. Cl.
CPC .............. *G01D 5/225* (2013.01); *G01D 18/00* (2013.01); *G01R 33/12* (2013.01); *H03K 5/00* (2013.01);
(Continued)

(58) Field of Classification Search
CPC ......... H03L 7/093; H03L 7/099; G01D 18/00; G01D 5/225; H03K 2005/00013; H03K 5/00; G01R 33/12
(Continued)

(56) References Cited

U.S. PATENT DOCUMENTS

| 8,030,918 B2 | 10/2011 | Doogue et al. |
| 8,063,634 B2 | 11/2011 | Sauber et al. |

(Continued)

OTHER PUBLICATIONS

Microsemi datasheet LX3301A "Inductive Sensor Interface IC with Embedded MCU" Jul. 2015, 21 pages.
(Continued)

*Primary Examiner* — Arnold M Kinkead
(74) *Attorney, Agent, or Firm* — Daly, Crowley, Mofford & Durkee, LLP (57) ABSTRACT

An interface circuit for a position sensor system including an oscillator generating an oscillation signal having a carrier frequency and a primary phase, a primary coil responsive to the oscillation signal, and a secondary coil electromagnetically coupled to the primary coil by a target and configured to generate a secondary signal having the carrier frequency and a secondary phase provides phase compensation. The interface circuit includes a sampling and conversion circuit configured to sample the secondary signal during sample periods and convert the secondary signal into a digital signal, a demodulator coupled to receive the digital signal and configured to demodulate the digital signal in order to generate a position signal indicative of a position of the target, a phase detector coupled to receive the position signal and configured to detect an alignment of the secondary phase with respect to the sample periods and generate a phase detector output signal indicative of whether the secondary phase is aligned with the sample periods, and a delay circuit responsive to the phase detector output signal and configured to apply a delay to the sampling and conversion circuit if the phase detector output signal indicates that the secondary phase is not aligned with the sample periods.

19 Claims, 7 Drawing Sheets

(51) Int. Cl.
  *H03K 5/00* (2006.01)
  *G01D 18/00* (2006.01)
  *G01R 33/12* (2006.01)
  *H03L 7/093* (2006.01)

(52) U.S. Cl.
  CPC .............. *H03L 7/093* (2013.01); *H03L 7/099* (2013.01); *H03K 2005/00013* (2013.01)

(58) Field of Classification Search
  USPC ........ 327/58; 324/228, 633, 600; 702/94, 85
  See application file for complete search history.

(56) References Cited

U.S. PATENT DOCUMENTS

| | | |
|---|---|---|
| 8,447,556 B2 | 5/2013 | Friedrich et al. |
| 9,664,494 B2 | 5/2017 | Fernandez et al. |
| 9,817,078 B2 | 11/2017 | Pepka et al. |
| 10,145,908 B2 | 12/2018 | David et al. |
| 10,670,672 B2 | 6/2020 | David et al. |
| 11,195,073 B2 * | 12/2021 | Kawaguchi ........ G06K 19/0709 |
| 2002/0089439 A1 * | 7/2002 | Pasolini ................ G11B 20/24 |
| 2019/0025052 A1 * | 1/2019 | Nee .................... G01D 5/2291 |

OTHER PUBLICATIONS

Integrated Device Technology, Inc. Datasheet ZMID5201/02/03 "Inductive Position Sensor IC", Oct. 5, 2018, 34 pages.

* cited by examiner

PHASE COMPENSATION FOR AN INDUCTIVE POSITION SENSOR

CROSS REFERENCE TO RELATED APPLICATIONS

Not Applicable.

STATEMENT REGARDING FEDERALLY SPONSORED RESEARCH

Not Applicable.

FIELD

This disclosure relates generally to inductive position sensors and, more particularly, to inductive position sensors having phase compensation.

BACKGROUND

As is known, inductive position sensors generally include a primary, or transmitting coil that generates a biasing field in response to an oscillation signal and one or more secondary, or receiving coils electromagnetically coupled to the primary coil for generating one or more secondary signals. The secondary signal can be processed to detect a position of a target arranged such that the coupling between the primary and secondary coils is a function of the target position. For example, the target can be a ferrous core around which the primary and secondary coils are wound. In general, the target position information is amplitude modulated in the secondary signal that can be demodulated synchronously with respect to the primary oscillation in order to extract target position information. In one example configuration, two secondary coils are arranged to generate respective secondary signals that contain amplitude modulated sine and cosine information that can be processed to determine target angle.

Various error sources, such as coil to target misalignment and resulting signal offset and amplitude errors, can be compensated. Inductive position sensors are used in a wide variety of applications including automotive and industrial applications and may perform the role of a motor position sensor.

SUMMARY

Described herein is an interface circuit and an inductive position sensor system containing the interface circuit in which phase compensation is provided. Phase compensation is achieved by detecting a phase alignment of a secondary signal with respect to sample periods of a sampling and conversion circuit and applying a delay to the sampling and conversion circuit based on the phase alignment detection. In this way, demodulation is performed synchronously with respect to the detected phase of the secondary signal (thus taking into account any phase shift) rather than with respect to the primary oscillation in order to permit accurate recovery of the target position. As a result, signal attenuation due to phase error (i.e., a difference between the phase of the primary, oscillation signal and the secondary signal) can be reduced and/or eliminated thereby providing a position sensor system with lower noise and greater permissible mechanical tolerances. Furthermore, such phase compensation is performed by a control loop automatically and continuously and is based on actual phase detection so that the phase compensation provides optimal results as phase shifts change over temperature, lifetime, and installation tolerances.

According to the disclosure, a position sensor system includes an oscillator configured to generate an oscillation signal having a carrier frequency and a primary phase, a primary coil coupled to receive the oscillation signal, a secondary coil electromagnetically coupled to the primary coil and configured to generate a secondary signal having the carrier frequency and a secondary phase. A sampling and conversion circuit is configured to sample the secondary signal during sample periods and convert the secondary signal into a digital signal and a demodulator coupled to receive the digital signal is configured to demodulate the digital signal in order to generate a position signal indicative of the position of the target. A phase detector coupled to receive the position signal is configured to detect an alignment of the secondary phase with respect to the sample periods and generate a phase detector output signal indicative of whether the secondary phase is aligned with the sample periods. A delay circuit responsive to the phase detector output signal is configured to apply a delay to the sampling and conversion circuit if the phase detector output signal indicates that the secondary phase is not aligned with the sample periods.

Features may include one or more of the following individually or in combination with other features. The demodulator can include a multiplier configured to multiply the digital signal by a square-wave signal, wherein the square-wave signal has a phase that is aligned with the primary phase. A phase-locked loop can be configured to generate the square-wave signal. The square-wave signal can have a frequency of at least four times the carrier frequency. The phase detector output signal can indicate that the secondary phase is not aligned with the sample periods if an amplitude of a current sample of the position signal does not match an amplitude of a previous sample of the position signal. The secondary coil can include a first secondary coil and a second secondary coil, wherein the first secondary coil is configured to generate a first secondary signal containing first amplitude modulated information and the second secondary coil is configured to generate a second secondary signal containing second amplitude modulated information that is ninety-degrees out of phase with respect to the first amplitude modulated information.

Also described is an interface circuit for a position sensor system including an oscillator generating an oscillation signal having a carrier frequency and a primary phase, a primary coil responsive to the oscillation signal, and a secondary coil electromagnetically coupled to the primary coil by a target and configured to generate a secondary signal having the carrier frequency and a secondary phase. The interface circuit can include a sampling and conversion circuit configured to sample the secondary signal during sample periods and convert the secondary signal into a digital signal and a demodulator coupled to receive the digital signal and configured to demodulate the digital signal in order to generate a position signal indicative of a position of the target. A phase detector coupled to receive the position signal is configured to detect an alignment of the secondary phase with respect to the sample periods and generate a phase detector output signal indicative of whether the secondary phase is aligned with the sample periods. The interface circuit can further include a delay circuit responsive to the phase detector output signal and configured to apply a delay to the sampling and conversion circuit if the phase detector output signal indicates that the secondary phase is not aligned with the sample periods.

Features may include one or more of the following individually or in combination with other features. The demodulator can include a multiplier configured to multiply the digital signal by a square-wave signal, wherein the square-wave signal has a phase that is aligned with the primary phase. A phase-locked loop can be configured to generate the square-wave signal. The square-wave signal can have a frequency of at least four times the carrier frequency. The phase detector output signal can indicate that the secondary phase is not aligned with the sample periods if an amplitude of a current sample of the position signal does not match an amplitude of a previous sample of the position signal. The secondary coil can include a first secondary coil and a second secondary coil, wherein the first secondary coil is configured to generate a first secondary signal containing first amplitude modulated information and the second secondary coil is configured to generate a second secondary signal containing second amplitude modulated information that is ninety-degrees out of phase with respect to the first amplitude modulated information.

According to a further aspect of the disclosure, an interface circuit for a position sensor system includes means for sampling the secondary signal during sample periods and converting the secondary signal into a digital signal, means for processing the digital signal to generate a position signal indicative of a position of the target, means for detecting an alignment of the secondary phase with respect to the primary phase based on the position signal, and means for applying a delay to the sampling and converting means if the secondary phase is not aligned with the sample periods. In embodiments, the alignment detecting means can include means for determining if an amplitude of a current sample of the position signal matches an amplitude of a previous sample of the position signal.

Also described is a method for detecting a position of a target in a position sensor system having an oscillator generating an oscillation signal having a carrier frequency and a primary phase, a primary coil responsive to the oscillation signal, and a secondary coil electromagnetically coupled to the primary coil and configured to generate a secondary signal having the carrier frequency and a secondary phase. The method can include sampling the secondary signal during sample periods, converting the sampled secondary signal into a digital signal, demodulating the digital signal to generate a position signal indicative of the position of the target, detecting an alignment of the secondary phase of the position signal with respect to the primary phase of the oscillation signal to generate a phase detector output signal indicative of whether the secondary phase is aligned with the sample periods, and delaying the sampling and conversion of the secondary signal if the secondary phase is not aligned with the sample periods.

Features may include one or more of the following individually or in combination with other features. Demodulating the digital signal can include multiplying the digital signal by a square-wave signal, wherein the square-wave signal has a phase that is aligned with the primary phase. The square-wave signal can be generated by a phase-locked loop and can have a frequency of at least four times the carrier frequency. The phase detector output signal can indicate that the secondary phase is not aligned with the sample periods if an amplitude of a current sample of the position signal does not match an amplitude of a previous sample of the position signal.

BRIEF DESCRIPTION OF THE DRAWINGS

The foregoing features of the disclosure, as well as the disclosure itself may be more fully understood from the following detailed description of the drawings, in which like reference numerals identify similar or identical elements.

DETAILED DESCRIPTION

Before describing the present disclosure, some introductory concepts and terminology are explained.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
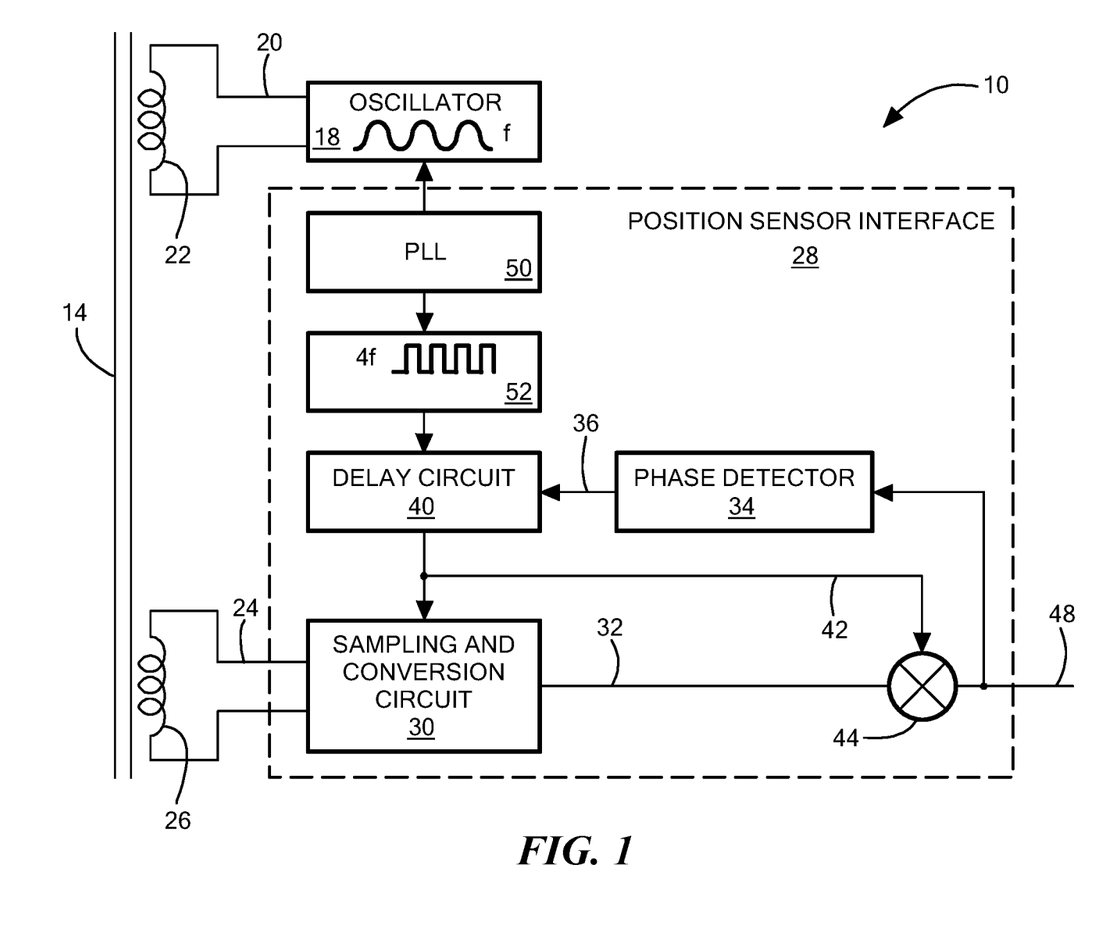
FIG. 1 is a block diagram of an inductive position sensor system including a position sensor interface with phase compensation according to the disclosure.

Referring to FIG. 1, an inductive position sensor system 10 configured to sense a position of a target 14 includes an oscillator 18 to generate an oscillation signal 20 having a carrier frequency and a primary phase, a primary coil 22 coupled to receive, or transmit the oscillation signal, and a secondary coil 26 electromagnetically coupled to the primary coil 22 and configured to generate a secondary signal 24 having the carrier frequency and a secondary phase. The coupling between the primary and secondary coils 22, 26 is a function of the target position. In an example embodiment, the target 14 is a metallic, non-ferromagnetic object and the primary coil 22 induces eddy currents in the target, which eddy currents, in turn induce a signal (i.e., the secondary signal 24) in the secondary coil 26. As the target 14 moves (e.g., rotates), the coupling between the primary winding 22 and the secondary winding 26 changes, so as to thereby encode target position information by way of amplitude modulation of the secondary signal 24. It will be appreciated that various mechanical configurations for the target 14 and primary and secondary coils 22, 26 are possible.

A position sensor interface circuit 28 includes a sampling and conversion circuit 30 configured to sample the secondary signal 24 during sample periods and convert the secondary signal into a digital signal 32 and a demodulator 44 coupled to receive the digital signal 32 and configured to demodulate the digital signal in order to generate a demodulated position signal 48 indicative of the position of the target 14. A phase detector 34 coupled to receive the position signal 48 is configured to detect an alignment of the secondary phase with respect to the sample periods and generate a phase detector output signal 36 indicative of whether the secondary phase is aligned with the sample periods. A delay circuit 40 is responsive to the phase detector output signal 36 and configured to update an internally stored delay approximation based on the value of the phase detector signal 36 and to apply a delay to the sampling and conversion circuit 30 if the phase detector output signal 36 indicates that the secondary phase is not aligned with the sample periods (or, in other words, if the phase detector output signal 36 indicates that the output of the delay circuit 42 is not aligned with the secondary phase).

With this arrangement, inaccuracies in position sensing due to phase error (i.e., a difference between the phase of the oscillation signal 20 and the phase of the secondary signal 24) are reduced and/or eliminated. Phase error can manifest as attenuation of the demodulated position signal 48. Thus, by providing phase error compensation, the position sensing system 10 can achieve lower noise performance and permit greater mechanical tolerances.

Sampling and conversion circuit 30 functions to integrate the secondary signal 24 over sample periods or windows to generate digital signal 32. It will be appreciated however, that other types of sampling and conversion circuits are possible, such as discrete time sampling circuits.

Figure 2:
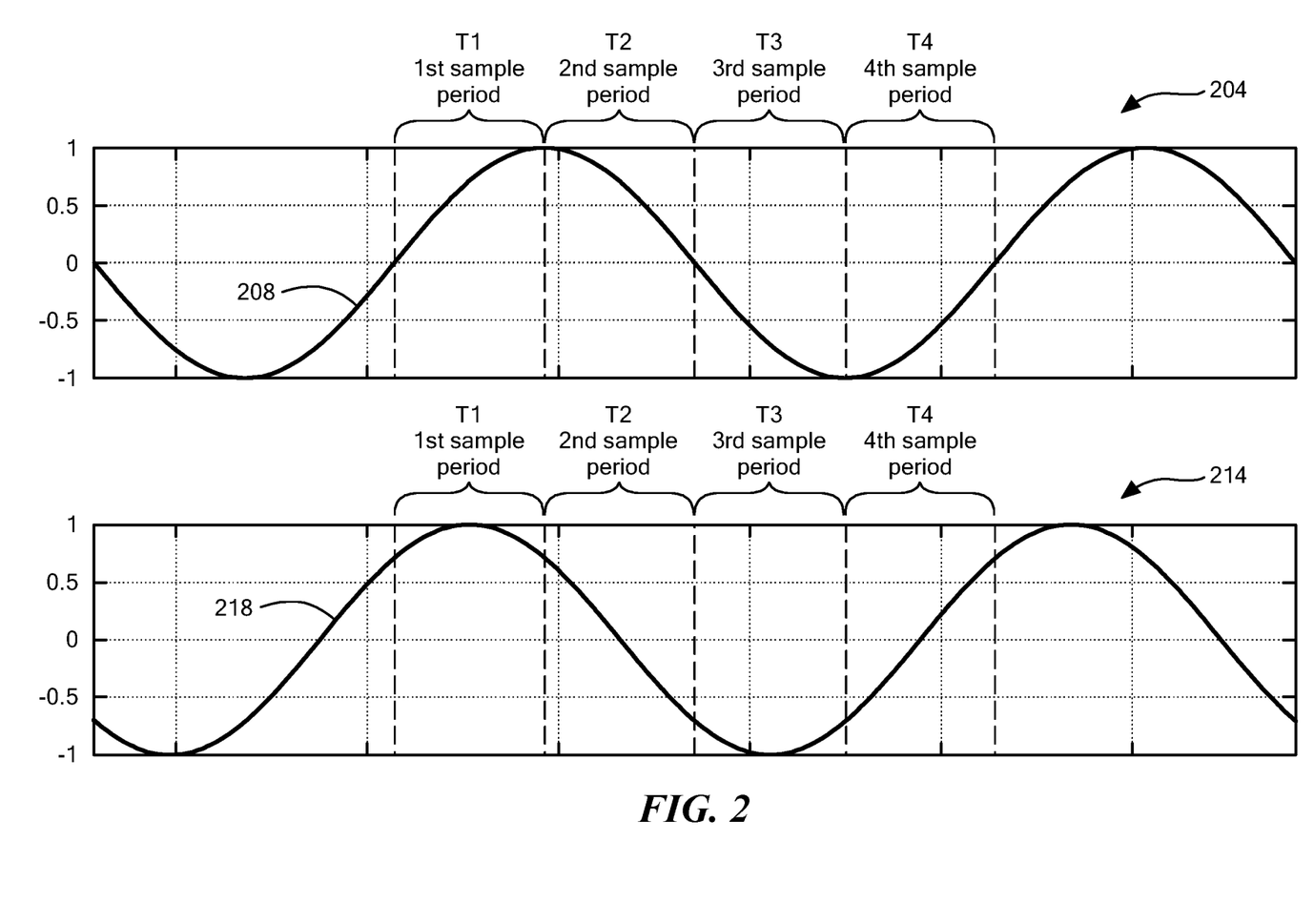
FIG. 2 shows example secondary signal waveforms associated with the inductive position sensor system of FIG. 1 both with and without phase error.

Referring also to FIG. 2, plots 204, 214 show example secondary signal waveforms associated with the inductive position sensor system 10 of FIG. 1. Plots 204, 214 have a horizontal axis with a scale in arbitrary units of time and a vertical axis with a scale in normalized units of voltage. Time intervals T1-T4 represent sample periods associated with the sampling and conversion circuit 30. Example secondary signal 208, that may be the same as or similar to signal 24 of FIG. 1, does not have any phase error with respect to oscillation signal (i.e., there is phase alignment between the oscillation signal 20 and the secondary signal 208) and example secondary signal 218, that may be the same as or similar to signal 24 of FIG. 1, has a phase error with respect to the oscillation signal 20 (i.e., there is a phase difference, or shift between the oscillation signal 20 and the secondary signal 218).

Consideration of phase-aligned secondary signal 208 reveals that this sinusoidal signal is centered on the sample periods T1-T4 in the sense that its maxima peaks and minima valleys coincide with sample period boundaries. Phase-shifted secondary signal 218 on the other hand is not centered with respect the sample periods T1-T4. It will be appreciated that integration of phase-aligned signal 208 over sample periods T1-T4 (as may be performed by sampling and conversion circuit 30) would result in a square-wave digital signal (as will be illustrated in FIG. 3A) since, during each two consecutive sample periods, the signal 208 is equal in magnitude and opposite in polarity with respect to the signal during the next two consecutive sample periods. For example, integration of signal 208 over sample periods T1 and T2 provides a result having an equal magnitude and opposite polarity with respect to integration of signal 208 over sample periods T3 and T4. Whereas integration of phase-shifted signal 218 on the other hand would result in a more discontinuous signal, for example as may have time delays between integration periods (as will be illustrated in FIG. 3A). This is illustrated by considering that integration of signal 218 over sample periods T1 and T2 does not provide a result that is equal in magnitude and opposite in polarity with respect to integration over sample periods T3 and T4.

Figure 3:
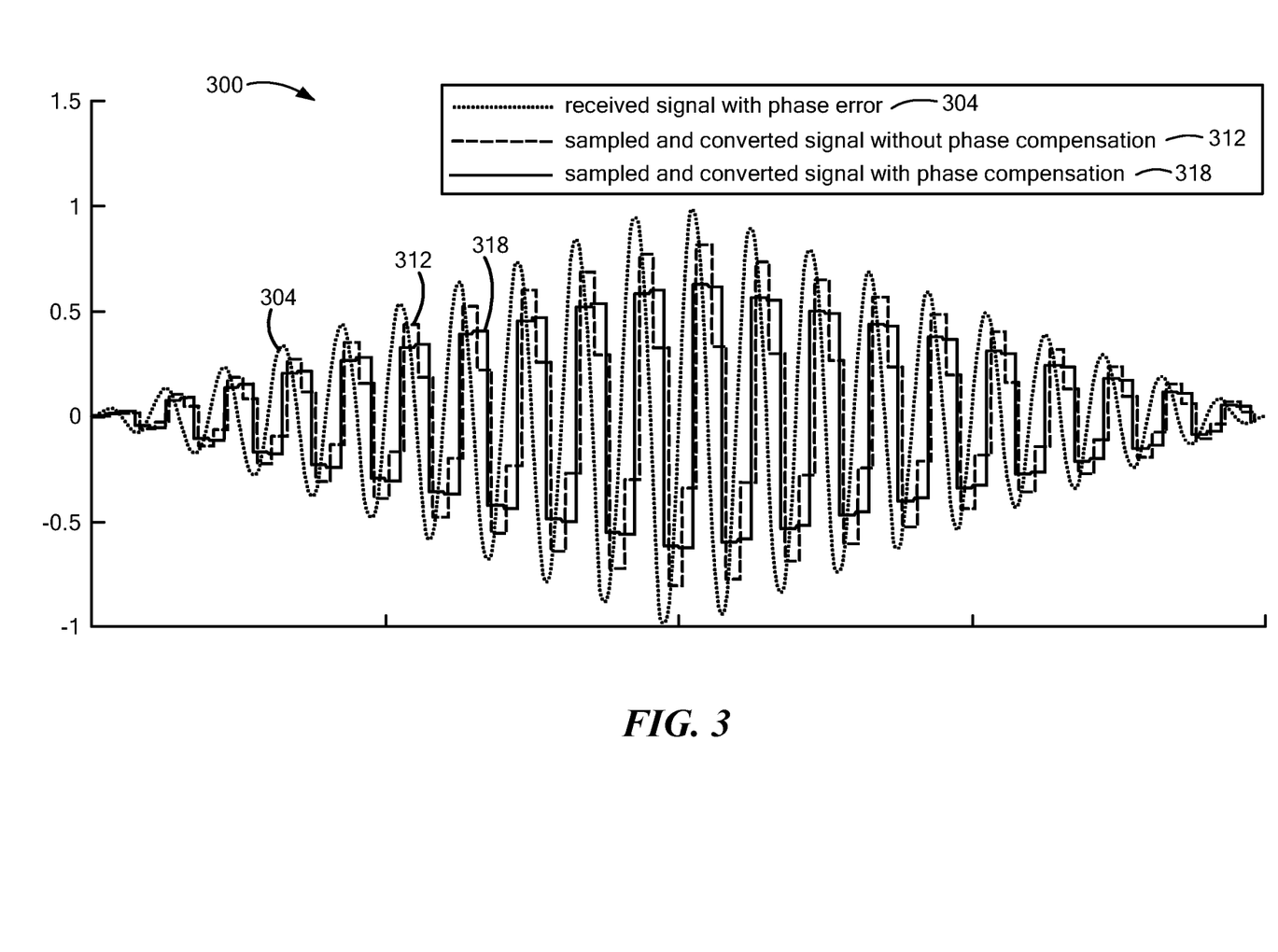
FIG. 3 shows an example secondary signal waveform with phase error and the resulting sampled and digitized signal with phase compensation performed by the position sensor system of FIG. 1 and also without phase compensation applied.
Figure 3A:
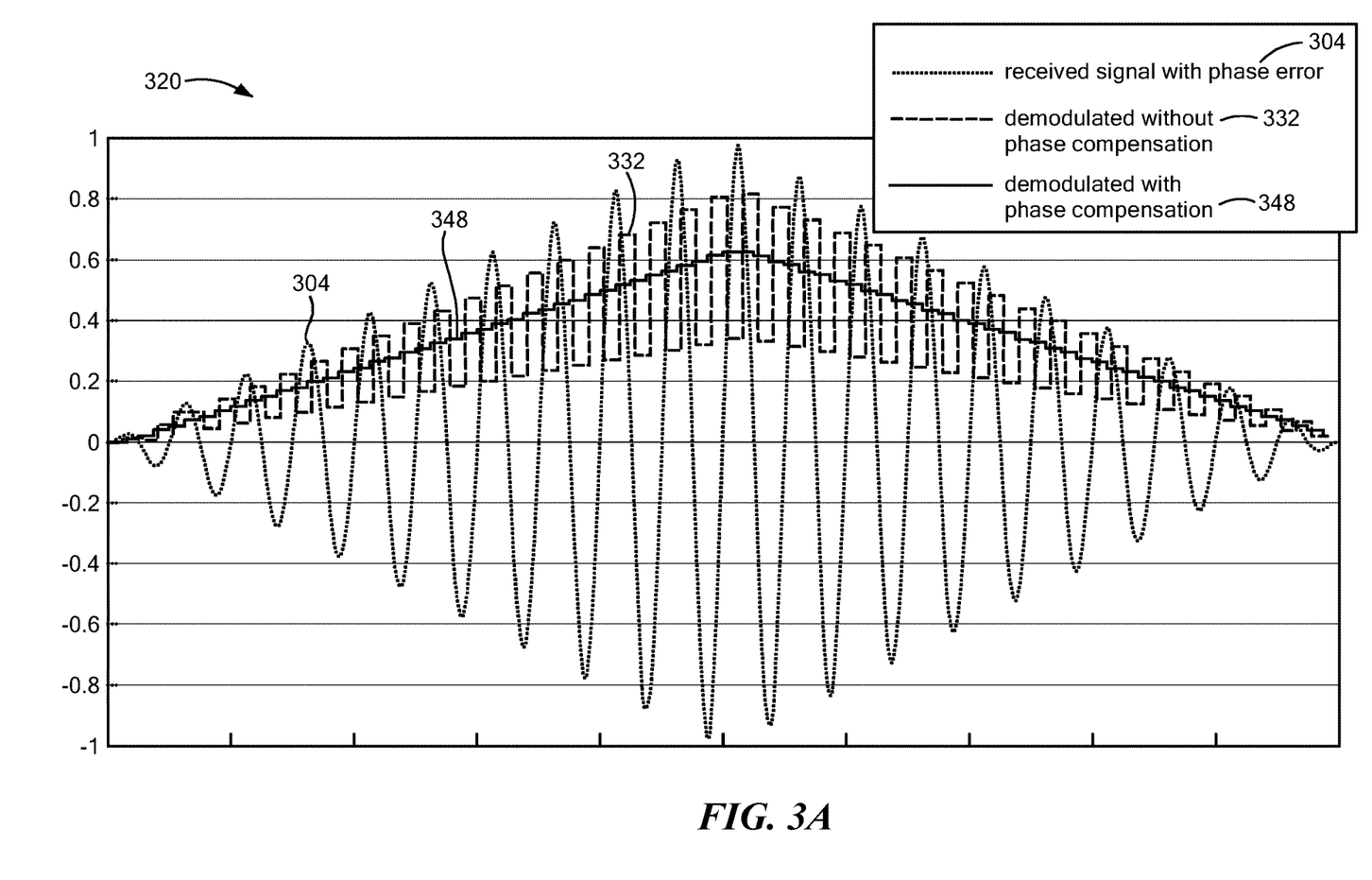
FIG. 3A shows an example secondary signal waveform with phase error and the resulting demodulated signal with phase compensation performed by the position sensor system of FIG. 1 and also without phase compensation applied.

Referring also to FIG. 3, a plot 300 shows an example secondary signal waveform 304 having a phase error with respect to the carrier frequency, a sampled and converted version 312 of the secondary signal 304 as would result if phase compensation were not applied (i.e., if the phase detector 34 and delay circuit 40 were not used), and a sampled and converted version 318 of the secondary signal 304 illustrating operation of the inductive position sensor system of FIG. 1 in which phase compensation is applied by the control loop including the phase detector 34 and delay circuit 40. Plot 300 has a horizontal axis with a scale in arbitrary units of time and a vertical axis with a scale in normalized units of voltage. Secondary signal 304 can be the same as or similar to secondary signal 24 of FIG. 1 or signal 218 of FIG. 2 and has a phase error with respect to the primary signal (i.e., secondary signal 304 has a phase error with respect to the carrier frequency of the primary signal). Consideration of signal 318 reveals a square-wave signal since the sample windows over which the received signal 304 is sampled and digitized coincide with symmetrical portions of the received signal 304; whereas consideration of signal 312 reveals a more discontinuous signal since, without the described phase compensation applied, the sample windows over which the received signal 304 is sampled and digitized do not coincide with symmetrical portions of the received signal 304.

Referring also to FIG. 3A, a plot 320 again shows example secondary signal waveform 304 having a phase error with respect to the carrier frequency, here along with a demodulated signal 332 that would result from demodulating signal 312 if phase compensation were not applied (i.e., if the phase detector 34 and delay circuit 40 were not used), and a demodulated signal 348 achieved by demodulating signal 318 illustrating operation of the inductive position sensor system of FIG. 1 in which phase compensation is applied by the control loop including the phase detector 34 and delay circuit 40. Plot 320 has a horizontal axis with a scale in arbitrary units of time and a vertical axis with a scale in normalized units of voltage. Demodulated signal 332 illustrates demodulation of signal 312 without phase compensation aspects of the disclosure applied (i.e., without use of the control loop including phase detector 34 and delay circuit 40) and thus does not correspond to any signals of FIG. 1. Demodulated signal 348 illustrates demodulation of signal 318 by operation of the interface 28 in applying phase compensation and thus, can be the same as or similar to demodulated position signal 48 (FIG. 1).

Consideration of demodulated signal 312 reveals that demodulating a phase shifted received signal (e.g., signal 304) without phase compensation applied yields a signal having an alternating pattern. Phase detector 34 (FIG. 1) operates to detect whether or not the demodulated signal is phase-aligned with the oscillation signal 20 and generate a phase detector output signal 36 accordingly.

A phase-locked loop (PLL) 50 can be used to generate a signal for use by demodulator 44 in order to extract, or recover target position information from the digital signal 32. More particularly, PLL 50 can be coupled to the oscillator 18 and to a frequency multiplier 52 and provide a frequency locked signal to such elements 18, 52. Multiplier 52 can generate a square-wave signal having a frequency that is a multiple of the carrier frequency of the oscillation signal 20.

Delay circuit 40 functions to apply a delay to the square-wave signal from the multiplier 52 if the phase detector output signal 36 indicates that the secondary phase is not aligned with the sample periods in order to thereby generate a square-wave signal 42 for use by demodulator 44. Thus, the square-wave signal provided by the multiplier 52 can be processed by the delay circuit 40 in order to generate a demodulating square-wave signal 42 that is phase-aligned with respect to the oscillation signal 20.

Demodulator 44 is configured to multiply the digital signal 32 by the square-wave signal 42 in order to generate the demodulated position signal 48. It will be appreciated by those of ordinary skill in the art that other demodulation circuitry and methodologies can be used, such as dividing the digital signal 32 by the oscillation signal 20 for example.

The alternating pattern of a demodulated secondary signal that exhibits phase error with respect to the oscillation signal can be used to detect a phase misalignment between the secondary signal 24 and the oscillation signal 20. For this reason, the frequency of the square-wave signal 42 is at least four times the frequency of the oscillation signal 20. This is because, if the square-wave signal 42 were less than four times the frequency of the oscillation signal 20, then an alternating pattern would not occur, and the phase misalignment could not be detected in the manner described below.

Phase alignment detection can be accomplished by comparing consecutive samples of the demodulated position signal 48. In particular, the phase detector output signal 36 can indicate that the secondary phase (i.e., phase of the secondary signal 24) is not aligned with the sample periods if an amplitude of a current sample of the demodulated position signal 48 does not match an amplitude of a previous sample of the demodulated position signal. An amplitude difference between consecutive samples of the demodulated position signal 48 indicates whether the applied delay is greater than or less than the actual delay between the primary signal and the secondary signal. The difference in phase between the primary signal and the secondary signal is indicated by the amount of delay applied by the delay circuit 40.

It is because of the increased sampling rate (i.e., at least four times the carrier frequency) that yields the alternating pattern in the demodulated signal 48 and thus, that permits use of this advantageous method of comparing consecutive samples in order to determine the phase alignment. It will be appreciated by those of ordinary skill in the art that a sampling rate of greater than four times the carrier frequency may be used as it would still allow for the phase error and position information to be independently recovered; however, because the phase error would no longer have a simple alternating pattern, a more complex pattern (based at least in part on the sampling rate and carrier frequency) would need to be detected in the demodulated signal 48.

In some embodiments, the message bandwidth (i.e., the envelope of the amplitude modulated secondary signal 24) can be small with respect to the carrier frequency (i.e., the frequency of the oscillation signal 20) in order for the difference between consecutive samples to accurately reflect the phase error.

The delay circuit 40 is coupled to receive the phase detector output signal 36 and is configured to introduce a delay to the sampling and conversion circuit 30 if the signal 36 indicates a phase misalignment. In some embodiments, signal 36 provides an indication of the phase shift between the digital signal 32 and the oscillation signal 20 and the delay introduced by the delay circuit 40 corresponds to the amount of the detected phase shift. For example, the introduced delay can be a delay or shift of the sample periods (e.g., periods T1-T4 in FIG. 2) and the phase shift indicated by signal 36 (i.e., the value of the signal 36) can determine the amount by which the sample periods are shifted.

In this way, the delay circuit 40 operates to align the demodulation phase by setting up the sample windows to account for any phase shift between the secondary signal 24 and the oscillation signal 20. Stated differently, demodulation is performed synchronously with respect to the detected phase of the secondary signal (thus taking into account any phase shift) rather than with respect to the primary oscillation in order to accurately recover target position information.

Further, the control loop including the sampling and conversion circuit 30, the phase detector 34 and the delay circuit 40 operate continuously to adjust the sample window delay in the sampling and conversion circuit 30 in order to minimize the phase related error. Phase compensation by the described control loop is performed automatically and continuously and is based on actual phase detection (rather than an estimate of phase error for example) so that the phase compensation provides optimal results as phase shifts change over temperature, lifetime, and installation tolerances.

Figure 4:
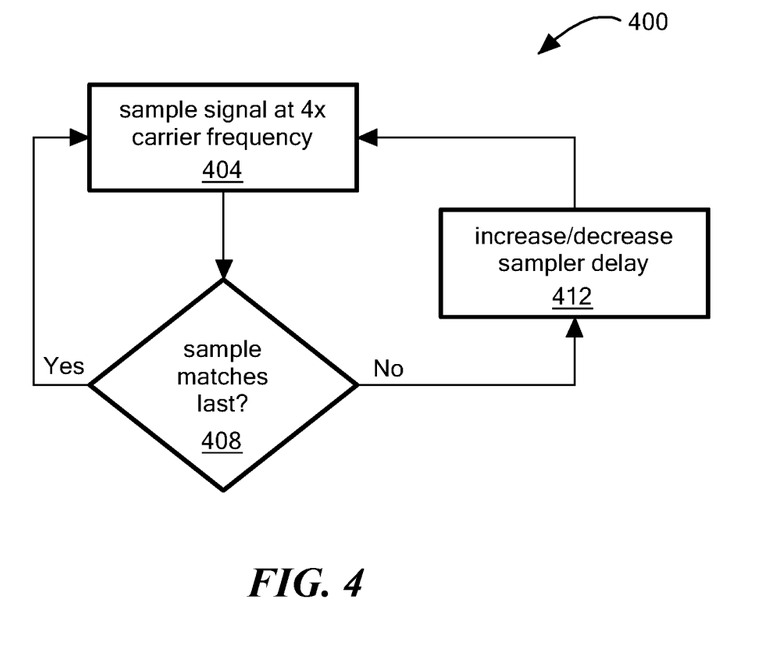
FIG. 4 is a flow diagram illustrating a phase alignment detection portion of secondary signal processing in the sensor system of FIG. 1.

Referring also to FIG. 4, a flow diagram illustrates a process 400 for detecting whether or not the demodulated signal 48 is phase-aligned with respect to the oscillation signal 20. The process commences at block 404 with the demodulated signal 48 being sampled (e.g., by the sampling and conversion circuit 30) at a frequency of at least four times the carrier frequency (i.e., the frequency of the oscillation signal 20).

At decision block 408, the current sample is compared to a last (i.e., a consecutively previous) sample. If it is determined that the amplitude of the current sample is the same as the amplitude of the last sample, then block 404 is repeated and the demodulated signal 48 is again sampled, as shown. Thus, blocks 404 and 408 are repeated as long as each sample has the same amplitude as the last sample.

If however it is determined at block 408 that the amplitude of the current sample is not the same as the amplitude of the last sample, then the delay circuit 40 (FIG. 1) introduces a delay to the sampling and conversion circuit 30 at block 412, which delay may be based on the extent to which the amplitude of the current sample and last sample differ.

It will be appreciated that other circuitry and methodologies are possible for detecting phase alignment of the demodulated signal 48 with respect to the oscillation signal 20. For example, simple carrier phase recovery such as using a single zero crossing comparator could be used to measure the phase of the secondary signal 24; however, the resulting accuracy may be limited due to offsets and offset drift.

Figure 5:
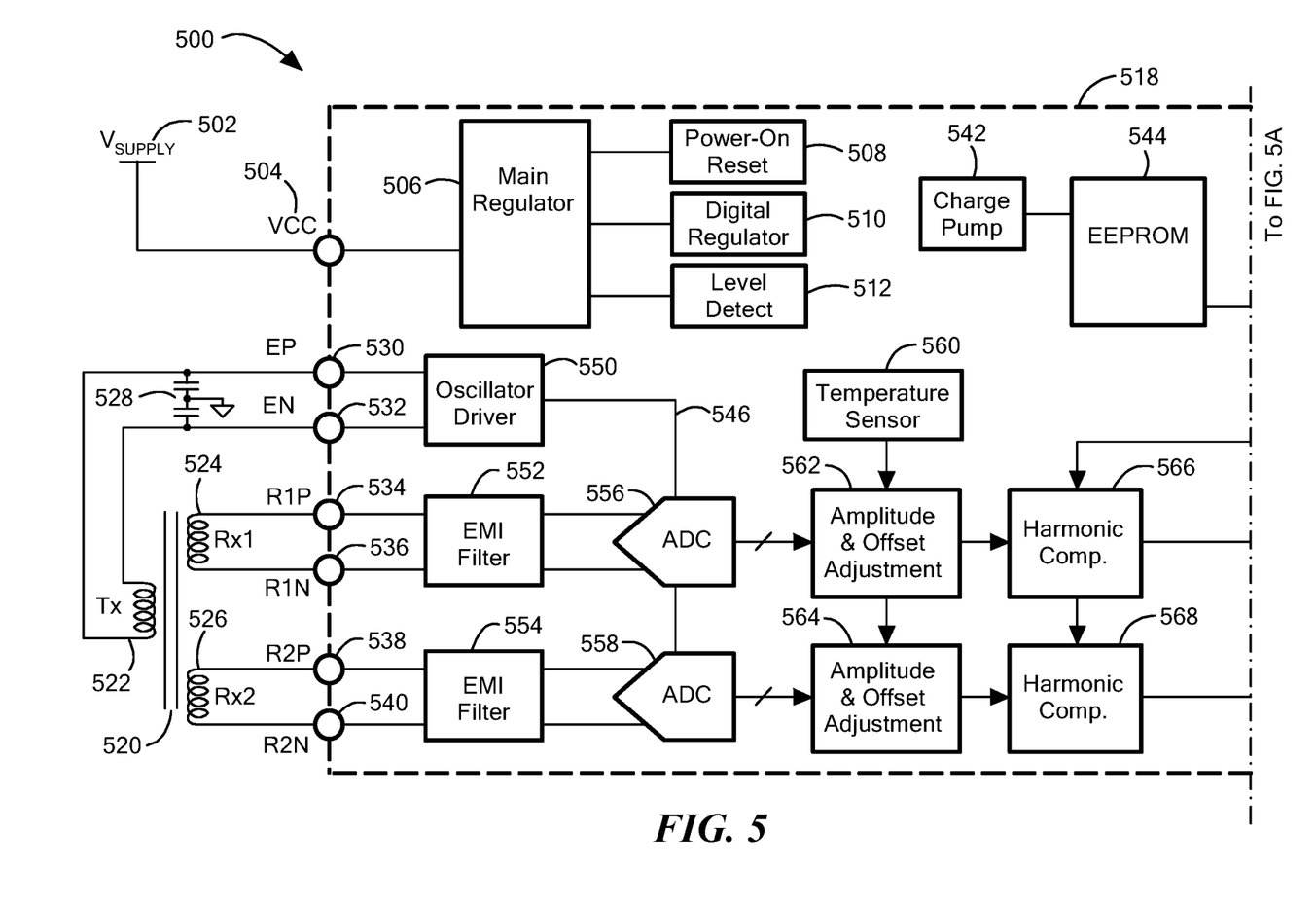
FIGS. 5 and 5A show a further block diagram of the position sensor interface of FIG. 1.
Figure 5A:
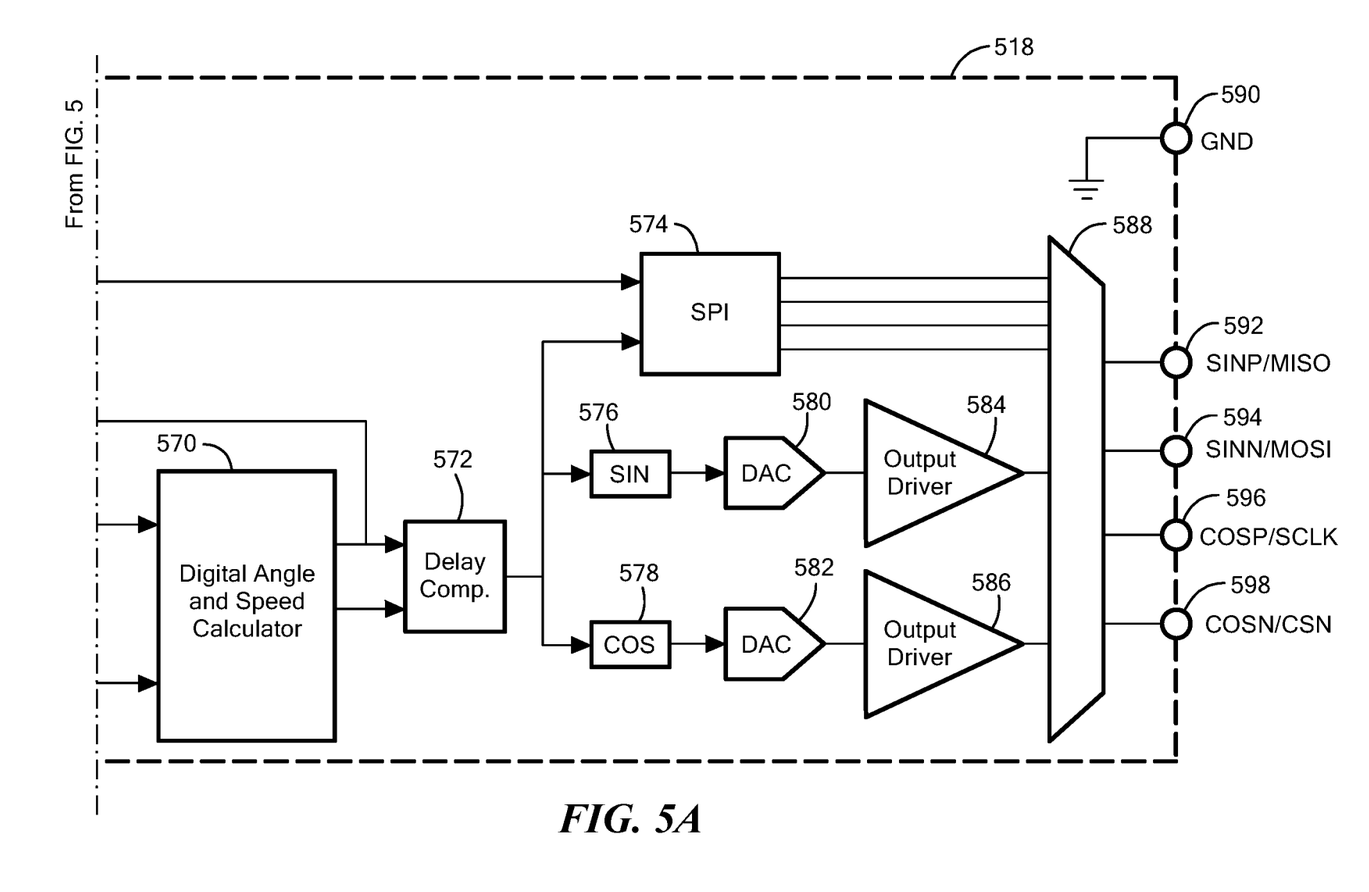

Referring also to FIGS. 5 and 5A, an inductive position sensor system 500 can be an implementation of the system 10 of FIG. 1. To this end, system 500 includes an oscillator, a primary coil 522, here two secondary coils 524, 526, and an interface circuit 518. Interface circuit 518 generates an oscillation signal for coupling to primary coil 522 through connections 530, 532 and is coupled to receive secondary signals from secondary coils 524, 526 through respective connections 534, 536, and 538, 540, as shown. Secondary coils 524, 526 are electromagnetically coupled to the primary coil 522 and mechanically coupled to a target 520 such that movement of the target causes position information to be encoded in the secondary signals from coils 524, 526 by amplitude modulation.

The oscillator 528 may take the form of the illustrated resonant circuit (e.g., an LC tank circuit including capacitors 528 and primary coil 522) or other oscillation circuits. As explained above, the oscillation signal has a carrier frequency and a primary phase and the secondary signal, here signals, have the carrier frequency and a respective secondary phase.

Secondary windings 524, 526 can be designed to have a predetermined phase relationship with respect to each other in order to suit a particular application. In the example embodiment, secondary windings 524, 526 are designed to generate respective secondary signals in quadrature (i.e., having a nominal ninety-degree phase shift with respect to each other). With this arrangement, the system 500 can generate quadrature sine and cosine output signals (at connections 592, 594 and 596, 598) that can be used to determine target speed, direction, and/or angle.

In some embodiments, multiple secondary signals have the same phase shift with respect to the primary and thus, phase error compensation can be achieved with a single control loop including the phase detector 34 and delay circuit 40. In other embodiments however, it may be desirable to provide multiple control loops, each dedicated to a different secondary signal.

Interface 518 can include two signal paths (e.g., an analog, digital or mixed signal path) each coupled to receive a secondary signal from a secondary winding 524, 526. Each signal path can include an EMI filter 552, 554 and an analog-to-digital converter (ADC) 556, 558 as shown. ADCs 556, 558 can be the same as or similar to sampling and conversion circuit 30 (FIG. 1) and thus, can be configured to sample the respective secondary signal (e.g., by integration over sample periods) and convert the integrated signal into a digital signal in order to generate a digital signal 546 that can be the same as or similar to digital signal 32 (FIG. 1).

Oscillator driver 550 contains a demodulator, that may be the same as or similar to demodulator 44 of FIG. 1, and phase error compensation control loop elements, that may be the same as or similar to phase detector 34, delay circuit 40, PLL 50, and frequency multiplier 52 (FIG. 1). Thus, oscillator driver 550 is configured to detect an alignment of the secondary phase with respect to the primary phase (based on observation of the demodulated signal) and apply a delay to the ADCs 556, 558 if the secondary phase is not aligned with the sample periods (i.e., the output of the delay circuit 40 is not aligned with the secondary phase). In this way, oscillator driver 550 operates to align the demodulation phase by setting up the sample windows to account for any phase shift between the secondary signals and the oscillation signal. Thus, demodulation is performed synchronously with respect to the detected phase of the secondary signals (thus taking into account any phase shift) rather than with respect to the primary oscillation in order to accurately recover target position information.

The signal paths may further include various signal conditioning and compensation of possible errors due to coils-target alignments and system design. For example, amplitude and offset adjustment may be provided by circuits 562, 564. In general, signal amplitudes will be affected by the current flowing through the primary coil 522 and the distance between the coil and the target. Temperature may also affect signal amplitudes and offsets. Thus, amplitude and offset adjustment circuits 562, 564 can be coupled to receive temperature information from a temperature sensor 560 and can operate to automatically track and compensate signal amplitudes and offsets. Harmonic compensators 566, 568 can perform compensation on input signals using correction parameters stored in EEPROM 544 during manufacture in order to thereby remove undesirable harmonics that could adversely affect position sensing.

A processor 570 is coupled to receive the conditioned channel signals and is configured to calculate an angle and/or speed of motion (e.g., rotation) of the target 520. For example, target angle can be computed using a CORDIC method and target speed can be computed as the derivative of target angle. For example, using consecutive angle values in time, speed is proportional to (angle_1−angle_0)/delta_time]. A delay compensator 572 can reduce the effective path latency of the interface 518. For example, the calculated speed can be used to correct the angle signal provided at the output of compensator 572 for the delays in signal path.

Sine and cosine elements 576, 578 can reconstruct sine and cosine differential signals that can be provided as interface output signals. The sine and cosine signals thus generated can be converted to analog signals by respective digital-to-analog converters (DACs) 580, 582. Output drivers 584, 586 can be coupled to receive the analog sine and cosine signals, as shown.

The interface output signals can be provided in one or more of various formats at one or more connections 592, 594, 596, 598 for coupling to external elements and systems (not shown). In the example interface 518, the output signals are provided in a selected one of a quadrature differential analog signals (SINP, SINN at connections 592, 594 and COSP, COSN at connections 596, 598) or an angle position signal provided in a Serial Peripheral Interface (SPI) format. SPI processor 574 controls a multiplexer 588 in order to provide interface output signals according to the SPI format or as differential sine and cosine output signals. The selection of interface output signal type can be based on user-programmable parameters stored in EEPROM 544. It will be appreciated that other output signal information such as speed and direction and other output signal formats are possible, including but not limited to Pulse Width Modulation (PWM) format, Single Edge Nibble Transmission (SENT) format, Local Interconnect Network (LIN) format, CAN (Controller Area Network) format, and/or an Inter-Integrated Circuit ($I^2C$) format to name a few.

Interface 518 can be provided in the form of an integrated circuit (IC) including one or more semiconductor die and can receive power $V_{SUPPLY}$ 502 at a connection 504 for coupling to an on-chip regulator 506 and can have a ground connection 590. A digital regulator 510 can generate a regulated voltage for powering digital circuitry of the interface and a power-on reset circuit 508 and a level detect circuit 512 can be provided. A charge pump 582 can be coupled to a memory device, such as an EEPROM 580 for storing operating values and parameters, such as output signal format, gain and offset correction coefficients, and harmonic correction parameters as examples.

While the interface 518 may be provided in the illustrated form of an IC with an analog front end portion and a digital portion, it will be appreciated that the particular delineation of which circuit functions are implemented in an analog fashion or with digital circuitry and signals can be varied. Further, some of the illustrated circuit functions can be implemented on an interface IC and other circuitry and functionality can be implemented on separate circuits (e.g., additional substrates within the same integrated circuit package, or additional integrated circuit packages, and/or on circuit boards).

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A position sensor system configured to sense a position of a target, comprising:
    an oscillator configured to generate an oscillation signal having a carrier frequency and a primary phase;
    a primary coil coupled to receive the oscillation signal;
    a secondary coil electromagnetically coupled to the primary coil and configured to generate a secondary signal having the carrier frequency and a secondary phase;
    a sampling and conversion circuit configured to sample the secondary signal during sample periods and convert the secondary signal into a digital signal;
    a demodulator coupled to receive the digital signal and configured to demodulate the digital signal in order to generate a position signal indicative of the position of the target;
    a phase detector coupled to receive the position signal and configured to detect an alignment of the secondary phase with respect to the sample periods and generate a phase detector output signal indicative of whether the secondary phase is aligned with the sample periods; and
    a delay circuit responsive to the phase detector output signal and configured to apply a delay to the sampling and conversion circuit if the phase detector output signal indicates that the secondary phase is not aligned with the sample periods.

2. The position sensor system of claim 1, wherein the demodulator comprises a multiplier configured to multiply the digital signal by a square-wave signal, wherein the square-wave signal has a phase aligned with the primary phase.

3. The position sensor system of claim 2, further comprising a phase-locked loop configured to generate the square-wave signal.

4. The position sensor system of claim 3, wherein the square-wave signal has a frequency of at least four times the carrier frequency.

5. The position sensor system of claim 1, wherein the phase detector output signal indicates that the secondary phase is not aligned with the sample periods if an amplitude of a current sample of the position signal does not match an amplitude of a previous sample of the position signal.

6. The position sensor system of claim 1, wherein the secondary coil comprises a first secondary coil and a second secondary coil, wherein the first secondary coil is configured to generate a first secondary signal containing first amplitude modulated information and the second secondary coil is configured to generate a second secondary signal containing second amplitude modulated information that is ninety-degrees out of phase with respect to the first amplitude modulated information.

7. An interface circuit for a position sensor system including an oscillator generating an oscillation signal having a carrier frequency and a primary phase, a primary coil responsive to the oscillation signal, and a secondary coil electromagnetically coupled to the primary coil by a target and configured to generate a secondary signal having the carrier frequency and a secondary phase, the interface circuit comprising:
    a sampling and conversion circuit configured to sample the secondary signal during sample periods and convert the secondary signal into a digital signal;
    a demodulator coupled to receive the digital signal and configured to demodulate the digital signal in order to generate a position signal indicative of a position of the target;
    a phase detector coupled to receive the position signal and configured to detect an alignment of the secondary phase with respect to the sample periods and generate a phase detector output signal indicative of whether the secondary phase is aligned with the sample periods; and
    a delay circuit responsive to the phase detector output signal and configured to apply a delay to the sampling and conversion circuit if the phase detector output signal indicates that the secondary phase is not aligned with the sample periods.

8. The position sensor system of claim 7, wherein the demodulator comprises a multiplier configured to multiply the digital signal by a square-wave signal, wherein the square-wave signal has a phase aligned with the primary phase.

9. The position sensor system of claim 8, further comprising a phase-locked loop configured to generate the square-wave signal.

10. The position sensor system of claim 9, wherein the square-wave signal has a frequency of at least four times the carrier frequency.

11. The position sensor system of claim 7, wherein the phase detector output signal indicates that the secondary phase is not aligned with the sample periods if an amplitude of a current sample of the position signal does not match an amplitude of a previous sample of the position signal.

12. The position sensor system of claim 7, wherein the secondary coil comprises a first secondary coil and a second secondary coil, wherein the first secondary coil is configured to generate a first secondary signal containing first amplitude modulated information and the second secondary coil is configured to generate a second secondary signal containing second amplitude modulated information that is ninety-degrees out of phase with respect to the first amplitude modulated information.

13. In a position sensor system having an oscillator generating an oscillation signal having a carrier frequency and a primary phase, a primary coil responsive to the oscillation signal, and a secondary coil electromagnetically coupled to the primary coil and configured to generate a secondary signal having the carrier frequency and a secondary phase, a method for detecting a position of a target, the method comprising:
  sampling the secondary signal during sample periods;
  converting the sampled secondary signal into a digital signal;
  demodulating the digital signal to generate a position signal indicative of the position of the target;
  detecting an alignment of the secondary phase of the position signal with respect to the sample periods to generate a phase detector output signal indicative of whether the secondary phase is aligned with the sample periods; and
  applying a delay to the sampling and converting of the secondary signal if the secondary phase is not aligned with the sample periods.

14. The method of claim 13, wherein demodulating the digital signal comprises multiplying the digital signal by a square-wave signal, wherein the square-wave signal has a phase aligned with the primary phase.

15. The method of claim 14, further comprising generating the square-wave signal with a phase-locked loop.

16. The method of claim 15, wherein generating the square-wave signal comprises generating the square-wave signal with a frequency of at least four times the carrier frequency.

17. The method of claim 13, wherein the phase detector output signal indicates that the secondary phase is not aligned with the sample periods if an amplitude of a current sample of the position signal does not match an amplitude of a previous sample of the position signal.

18. An interface circuit for a position sensor system including an oscillator generating an oscillation signal having a carrier frequency and a primary phase, a primary coil responsive to the oscillation signal, and a secondary coil electromagnetically coupled to the primary coil by a target and configured to generate a secondary signal having the carrier frequency and a secondary phase, the interface circuit comprising:
  means for sampling the secondary signal during sample periods and converting the secondary signal into a digital signal;
  means for processing the digital signal to generate a position signal indicative of a position of the target;
  means for detecting an alignment of the secondary phase with respect to the sample periods based on the position signal; and
  means for applying a delay to the sampling and converting means if the secondary phase is not aligned with the sample periods.

19. The interface circuit of claim 18, wherein the alignment detecting means comprises means for determining if an amplitude of a current sample of the position signal matches an amplitude of a previous sample of the position signal.

* * * * *

UNITED STATES PATENT AND TRADEMARK OFFICE
CERTIFICATE OF CORRECTION

PATENT NO. : 11,435,206 B2
APPLICATION NO. : 17/082151
DATED : September 6, 2022
INVENTOR(S) : Mathew Drouin It is certified that error appears in the above-identified patent and that said Letters Patent is hereby corrected as shown below:

In the Specification

Column 5, Line 51 delete "circuit 42" and replace with --circuit 40--.

Column 6, Line 8 delete "signal (i.e.," and replace with --signal 20 (i.e.,--.

Column 6, Line 20 delete "respect the" and replace with --respect to the--.

Column 9, Line 23 delete "oscillator," and replace with --oscillator 528,--.

Column 10, Line 45 delete "_time]." and replace with --_time.--.

Column 10, Line 61 delete "of a quadrature" and replace with --of quadrature--.

Column 11, Line 17 delete "pump 582" and replace with --pump 542--.

Column 11, Line 18 delete "EEPROM 580" and replace with --EEPROM 544--.

Signed and Sealed this
Nineteenth Day of September, 2023

Katherine Kelly Vidal
*Director of the United States Patent and Trademark Office*